United States Patent
Spence et al.

(10) Patent No.: US 12,400,731 B2
(45) Date of Patent: Aug. 26, 2025

(54) ONE-TIME-PROGRAMMABLE (OTP) MEMORY WITH ERROR DETECTION

(71) Applicant: NXP USA, Inc., Austin, TX (US)

(72) Inventors: Nicholas Justin Mountford Spence, Phoenix, AZ (US); Jorge Ernesto Perez Chamorro, Préverenges (CH)

(73) Assignee: NXP USA, Inc., Austin, TX (US)

( * ) Notice: Subject to any disclaimer, the term of this patent is extended or adjusted under 35 U.S.C. 154(b) by 282 days.

(21) Appl. No.: 18/334,614

(22) Filed: Jun. 14, 2023

(65) Prior Publication Data

US 2024/0420795 A1    Dec. 19, 2024

(51) Int. Cl.
| G11C 29/42 | (2006.01) |
| G11C 29/00 | (2006.01) |
| G11C 29/52 | (2006.01) |
| H03K 19/20 | (2006.01) |

(52) U.S. Cl.
CPC ............ *G11C 29/785* (2013.01); *G11C 29/52* (2013.01); *H03K 19/20* (2013.01)

(58) Field of Classification Search
CPC ....... G11C 29/785; G11C 29/52; G11C 17/18; G11C 29/42; H03K 19/20
See application file for complete search history.

(56) References Cited

U.S. PATENT DOCUMENTS

| 8,281,198 B2 | 10/2012 | Henry et al. | |
| 8,345,501 B2 | 1/2013 | Jeong | |
| 9,218,239 B2 | 12/2015 | Morgan | |
| 2003/0126513 A1 | 7/2003 | Wuidart | |
| 2013/0262962 A1 | 10/2013 | Chen et al. | |
| 2016/0005492 A1* | 1/2016 | Barsilai | G11C 17/146 365/104 |
| 2018/0060164 A1 | 3/2018 | Pandey et al. | |
| 2019/0006017 A1* | 1/2019 | Reinman | H10B 20/25 |
| 2020/0371872 A1* | 11/2020 | Fuller | G11C 29/52 |
| 2022/0130480 A1* | 4/2022 | Takenaka | G11C 17/16 |

* cited by examiner

*Primary Examiner* — Hien N Nguyen
(74) *Attorney, Agent, or Firm* — Joanna G. Geld

(57) ABSTRACT

A controller for a one-time-programmable (OTP) memory is configured to, in response to a write request to program a single bit of an OTP value to the OTP memory, program a bit of the OTP value in the OTP memory, generate a set of PCBs corresponding to the OTP value, and program the PCBs into the OTP memory. Each PCB of the set of PCBs is generated as a logic function of a different subset of bits of the OTP value. The logic function only results in each PCB being programmed or remaining programmed in the OTP memory but not cleared. The OTP controller may be configured to, in response to the write request, program both the bit of the OTP value and a redundant bit, in which the set of PCBs includes a first PCB based on the bit and a second PCB based on the redundant bit.

20 Claims, 2 Drawing Sheets

REDUNDANT MODE:
OTP VALUE [31:0]
UH VALUE [31:16] = LH VALUE [15:0]

PCB[4:0]
PCB[0] = b29 OR b27 OR b22 OR b20 OR b15 OR b12 OR b7 OR b5 OR b3 OR b0
PCB[1] = b30 OR b25 OR b23 OR b18 OR b16 OR b13 OR b10 OR b8 OR b6 OR b1
PCB[2] = b28 OR b26 OR b24 OR b21 OR b19 OR b17 OR b11 OR b9 OR b4 OR b2
PCB[3] = b14
PCB[4] = b31

ONE-TIME-PROGRAMMABLE (OTP) MEMORY WITH ERROR DETECTION

BACKGROUND

Field

This disclosure relates generally to OTP memories, and more specifically, to an OTP memory with error detection.

Related Art

Error detection and correction code (ECC) is commonly used to detect, and in some cases correct, errors in data stored within a memory. For example, ECC check bits are typically generated and stored along with each data word. This can be done for data stored in any type of memories, including OTP memories. However, in OTP memories, once a data word and its corresponding ECC checkbits are stored (i.e. programmed into the OTP memory), any programmed bits cannot be changed (e.g. cleared). For this reason, an entire data word and its corresponding ECC checkbits must all be programmed at once into the OTP memory. That is, ECC cannot be used in cases in which the contents of a data word in the OTP memory are incrementally programmed (e.g. are not all programmed at once, but programmed sequentially over time).

In those systems which are unable to use ECC, redundant bits can instead be used in which each data bit is compared to its redundant bit to determine if an error is present. However, this method works best for single bit errors and provides far less robustness than ECC. Therefore, a needs exists for improved error detection in an OTP memory in which bit values can be programmed into the OTP memory at different times.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, in the case in which bits of an OTP memory can be programmed at different times, programming check bits (PCBs) can be used to provide improved error detection. In one embodiment, PCBs can be used in addition to redundant bits to provide error detection. Further, PCBs can be used to provide information as to whether an error is likely due simply to a bit failure (indicating a reliability issue) or due to an attack (indicating a security issue). In one embodiment, a set of PCBs is generated and stored with each addressable (multi-bit) OTP value. In one embodiment, a corresponding upper half of each OTP value corresponds to redundant bits for a corresponding lower half of the OTP value. Also, each bit of an OTP value can be programmed at different times. Unlike ECC check bits, though, the set of PCBs for each OTP value can be incrementally updated as bits of the OTP value are programmed over time. In one embodiment, the set of PCBs for an OTP value includes multiple PCBs and is generated such that a bit and a redundant bit of the OTP value are not used to generate the same PCB of the set of PCBs. In one embodiment, one or more PCBs of the set of PCBs is also generated based on one or more bits of the OTP value which are most likely to be programmed. Each time an OTP value is read from the OTP memory, a corresponding set of PCBs is also received and used to determine whether or not an error is indicated with the OTP read.

Figure 1:
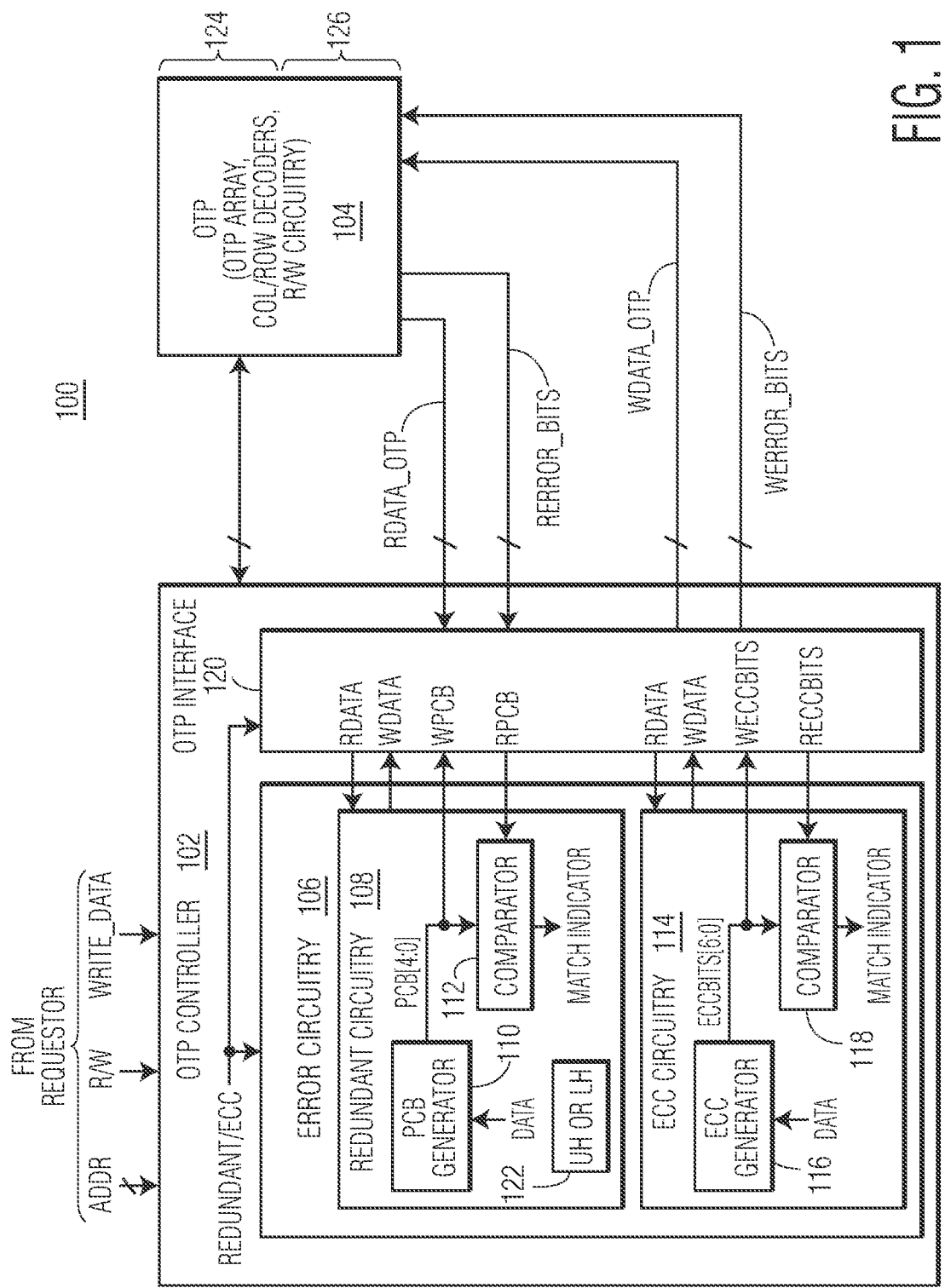
FIG. 1 illustrates, in block diagram form, a one-time-programmable (OTP) memory system having an OTP controller and an OTP memory, in accordance with one embodiment of the present invention.

FIG. 1 illustrates, in block diagram form, an OTP system 100 which includes an OTP memory 104 (also referred to simply as OTP 104) and an OTP controller 102 coupled to OTP 104. OTP 104 includes an OTP array configured to store any number of OTP values. In one embodiment, the OTP array is implemented as a fuse box, in which each OTP value corresponds to a fuse value. In the embodiments described herein, it is assumed that each addressable OTP value includes 32 bits. However, in other embodiments, each OTP value may include more or fewer bits. OTP 104 also includes related circuitry used in performing reads from and writes to the OTP array, such as, for example, column and row decoders, read circuitry (i.e. sensing circuitry), and write circuitry, in which this related circuitry can be implemented as known in the art. As used herein, each bit in the OTP array can either be in a programmed state or an unprogrammed state, in which a "programmed bit" corresponds to a first logic state and an "unprogrammed bit" to a second logic state, opposite the first logic state. For example, in the case of a fuse box, a programmed bit may correspond to a logic level one and an unprogrammed bit to a logic level zero. In one embodiment, the state of an unprogrammed bit is referred to as its virgin state. In this case, the virgin state of the fuse box is a logic level zero. Typically, a reliability failure of a bit in the OTP corresponds to a programmed bit returning back to an unprogrammed bit (to its virgin state). However, for an attack, one or more OTP bits of the OTP array can be forced to a programmed state or read values from the OTP array can be modified to provide different read values than the actual values stored in the OTP array, such as to incorrectly provide the read values as all ones or all zeros.

OTP controller 102 receives access requests from a requestor. For example, OTP memory system 100 can be integrated as part of a system on a chip (SoC), in which this requestor can be, for example, any requestor in the SoC. In one embodiment, the requestor is a core or other type of bus master in the SoC, and the access request can be received via a system interconnect of the SoC. Each access request can either be a read access request or a write access request, and has a corresponding access address identifying a location in the OTP array. OTP controller 102 therefore receives, for each access request, a corresponding access address (ADDR), a read/write indicator (R/W) which indicates whether the access request is a read or write access request, and, in the case of a write access request, write data (WRITE_DATA). In other embodiments, additional control signals, in addition to R/W, may be received for each access request. In one embodiment, OTP controller 102 provides the access address (ADDR) to OTP 104, in which a first portion of the access address can be used by row decoders to activate an addressed row and a second portion of the access address can be used by column decoders to activate one or more appropriate columns, as known in the art. Note that in alternate embodiments, any or all of the column and row decoders, read circuitry, write circuitry, and other related circuitry outside of the OTP array itself can be located outside of OTP memory 104 such that OTP memory 104 includes only the OTP array or, alternatively, can be considered as part of OTP controller 102.

In response to a write access request, OTP controller 102 generates OTP write data (WDATA_OTP) to be programmed into the OTP array based on the received WRITE_DATA. In addition to WDATA_OTP, OTP controller 102 also generates and provides corresponding error bits (WERROR_BITS) for storage into the OTP array of OTP 104. For a read access request, OTP controller 102 receives read data (RDATA_OTP) from the OTP array of OTP 104. In addition to RDATA_OTP, OTP controller 102 also receives corresponding error bits (RERROR_BITS). RDATA_OTP is processed by OTP controller 102, using RERROR_BITS, to provide read data (READ_DATA) and a corresponding ERROR INDICATOR back to the requestor in response to the read access request.

As will be described in more detail below, information stored in OTP 104 can be stored using different protection schemes (i.e. error detection schemes). For example, a portion of the data in OTP 104 (in portion 124 of OTP 104) can be stored using an ECC protection scheme, as known in the art. In this example, in the case of a 32-bit OTP value, a corresponding 7-bit ECC check bit value (also referred to as a syndrome value) is stored with each 32-bit OTP value. The ECC check bit values can be generated as known in the art, using, for example, a single bit error correction and double bit error detection encoding. The 7-bit ECC check bit value can be referred to as the corresponding error bits for the OTP value for this protection scheme. (Note that, in some embodiments, additional control bits can be stored with the 7-bit ECC check bit value as the corresponding error bits.) The 7-bit ECC check bit value, though, is generated using the entire 32-bit OTP value, and is stored at the same time as the OTP value. Once these values are written to OTP 104, no programmed bit can be subsequently cleared (unprogrammed). Therefore, it is not possible to incrementally generate an ECC check bit value if bits of the corresponding 32-bit OTP value are partially written or are written at different times.

Another portion of the data in OTP 104 (in portion 126 of OTP 104) can instead be stored using a redundant bit protection scheme (also referred to as a redundant protection scheme). In the case of the redundant bit protection schemed, each bit value is written twice (in duplicate) into the OTP array. Upon a read of the bit value, both of the values (the bit value and its redundant bit value) are read, in which an error is indicated if they do not match. In some embodiments, such as in the case of fuses in which fuse bits fail to zero, upon a read of the bit value, the bit value and its redundant bit value are logically ORed to provide the correct value. In the case of the redundant bit protection scheme, a write of one or more fuse bits results in writing twice the number of bits as the one or more fuse bits. In the descriptions herein, it is assumed that the redundant bit protection scheme stores each bit in duplicate, but alternate embodiments may store each bit more than twice, such as in triplicate. With the redundant bit protection scheme, in addition to programming each bit twice, programming check bits (PCBs) are also generated and stored with each OTP value. These PCBs can be referred to as the corresponding error bits for this protection scheme. Therefore, in the case of a 32-bit OTP value, a set of five PCBs is generated and stored with each OTP value. However, unlike the ECC check bit values, the PCBs can be generated sequentially, as each bit of an OTP value is programmed (set), even if the bits of an OTP value are programmed at different points in time. Additional details as to how the PCBs are generated will be described below in reference to FIG. 2.

Still referring to FIG. 1, in the case that OTP 104 is configured to store data using both the ECC protection scheme as well as the redundant bits protection scheme, a bit (Redundant/ECC indicator) can be generated for each access request and used by OTP controller 102 to indicate which scheme is to be used for a particular access. This indicator can be generated in many different ways, by OTP controller 102 or by other circuitry within the SoC containing memory system 100. In one embodiment, storage circuitry within OTP controller 102, such as a one-bit read only memory (ROM), can be used to indicate whether each access address of OTP 104 uses the redundant or ECC protection scheme. Alternatively, this information can be determined on the fly (i.e. dynamically) based on a bit stored with each OTP value. In the illustrated embodiments, regardless of how it is generated, the redundant/ECC indicator is used by OTP controller 102 to process read and write requests with the appropriate protection scheme.

OTP controller 102 includes error circuitry 106, coupled to receive the Redundant/ECC indicator, and an OTP interface 102, also coupled to receive the Redundant/ECC indicator. Error circuitry 106 includes redundant circuitry 108 which is used in implementing the redundant protection scheme for read and write accesses and ECC circuitry 114 used in implementing the ECC protection scheme for read and write accesses. In one embodiment, OTP interface 120, in response to a read access request, receives RDATA_OTP and RERROR_BITS from OTP 104. In the case the Redundant/ECC bit has a first value indicating the redundant protection scheme, provides RDATA_OTP as read data (RDATA) to redundant circuitry 108 and provides RERROR_BITS as read PCBs (RPCB) to redundant circuitry 108. In the case the Redundant/ECC bit has a second value, different from the first value, indicating the ECC protection scheme, OTP interface 120 provides RDATA_OTP as read data (RDATA) to ECC circuitry 114 and provides RERROR_BITS as read ECC check bits (RECCbits) to ECC circuitry 114. OTP interface 120, in response to a write access request, provides WDATA_OTP and WERROR_BITS to OTP 104. In the case the Redundant/ECC bit has the first value, OTP interface 120 receives write data (WDATA) and write PCBs (WPCB) from redundant circuitry 108 and provides them as WDATA_OTP and WERROR_BITS, respectively, to OTP 104. In the case the Redundant/ECC bit has the second value, OTP interface 120 receives write data (WDATA) and write ECC check bits (WECCbits) from ECC circuitry 114 and provides them as WDATA_OTP and WERROR_BITS, respectively, to OTP 104.

Also, in alternate embodiments, OTP interface 120 may not be present in which case, logic within OTP 104, such as within the read/write circuitry or other related circuitry of OTP 104, handles communicating the correct information between the different error correction circuitries (e.g. 108 and 114) and OTP 104. Also, although the description of OTP 104 for the illustrated embodiment implements two different protection schemes, in an alternate embodiment, all of OTP 104 uses the redundant protection scheme (with the PCBs), in which case, OTP interface 120 and ECC circuitry 114 are not necessary. In this example, RDATA_OTP and RERROR_BITS can be provided directly as RDATA and RPCB to redundant circuitry 108 and WDATA and WPCB can be received directly from redundant circuitry 108 as WDATA_OTP and WERROR_BITS. In yet other alternate embodiments, more than two protection schemes (e.g. including the redundant bit protection scheme and one or more protection schemes in addition to or in place of ECC protection scheme) can be used within OTP 104, in which error circuitry 106 and OTP interface 120 can be expanded or changed accordingly.

Redundant circuitry 108 of FIG. 1 includes a PCB generator 110, a comparator 112, and comparison logic 122 to compare the upper half (UH) of an OTP value with the lower half (LH) of the OTP value. PCB generator 110 is configured to receive DATA, which can either be WRITE_DATA received by OTP controller 102 with a write access request or RDATA received from OTP 104, and is configured to generate the PCBs (which can be provided as WPCB for a write access request). Comparator 112 is configured to compare the generated PCBs from PCB generator 110 with expected PCBs (RPCB from OTP 104 for a read access request), and generate a match indicator in response to the comparison. In the illustrated embodiment, it is assumed that each OTP value written to or read from OTP 104 is a 32-bit value (OTP [31:0]), in which the UH corresponds to the upper 16 bits (OTP [31:16]) and the LH to the lower 16 bits (OTP [15:0]). In this example, the UH corresponds to the more significant bits (MSBs) and the LH to the less significant bits (LSBs), in which, in the illustrated embodiment, UH can be referred to as the most significant word and LH the least significant word. UH can also be referred to as the redundant word or redundant portion for LH. PCB generator 112, for each 32-bit OTP value received as DATA, generates five PCBs (PCB[4:0]). Redundant circuitry 108 also includes logic 122 to determine whether UH=LH. In one embodiment, logic 122 is implemented as a logical OR between UH and LH.

In operation, redundant circuitry 108, in response to a write access request, receives WRITE_DATA and ADDR. Note that in the case of a write access request, the write can be of one or more bits within OTP 104, in which a write corresponds to programming the one or more bits to a logic level one. That is, it need not be a write of a full 32-bit OTP value, in which some of the values in a 32-bit OTP value can still be subsequently programmed. In the case of a partial write, WRITE_DATA can be expanded by OTP controller 102 to a full (e.g. 32-bit) write value (by, for example, packing the partial write data with additional zeros). Regardless of whether it is a full write or a partial write, the full WRITE_DATA (OTP value [31:0]) is provided as DATA to PCB generator 110 which generates a set of PCBs (PCB[4:0]). The full WRITE_DATA (OTP value [31:0]) and WPCB are provided as WDATA_OTP and WERROR_BITS, respectively, to OTP 104 to be programmed into the OTP array of OTP 104. (In one embodiment, an OTP value and its corresponding PCBs are written in adjacent memory locations of OTP 104, but alternatively, the corresponding PCBs can be written elsewhere within OTP 104.) As will be seen, even as additional bits get subsequently programmed to a particular 32-bit OTP value in OTP 104, PCB[4:0] can incrementally be programmed because, at most, an unprogrammed bit of the corresponding PCBs will later be programmed when written to OTP 104, but a programmed bit need not be subsequently cleared or erased back to an unprogrammed state (which is not possible in an OTP). This is achieved by generating each PCB in the corresponding PCB[4:0] with, for example, a logical ORing (which is an inclusive OR operation), and not XORing (which is an exclusive OR operation), of a subset of bit values (i.e. bits) of the 32-bit OTP value.

Figure 2:
FIG. 2 illustrates, in diagrammatic form, an example implementation of generating programming check bits (PCBs) during operation in redundant mode, in accordance with one embodiment of the present invention.

FIG. 2 illustrates, in diagrammatic form, an example generation of a set of five PCBs (PCB[4:0]) for a 32-bit OTP value (OTP value [31:0]). The generation of the five PCBs of FIG. 2 (referred to generally as the PCBs for the 32-bit value) can be performed by PCB generator 110. For any programming of a bit in an OTP value of OTP 104, a bit in both its LH value and UH value is programmed, such that UH [31:16] equals LH [15:0]. For example, if bit [2] of OTP value [31:0] is programmed, both LH [2] and UH [18] (its redundant bit) are programmed. In this manner, each time bit [2] is read, a comparison of the redundant bits the read OTP values [2] and will be performed to determine if a match exists. In one embodiment, this comparison is performed by performing a bit-wise comparison of LH [31:16] with UH [15:0] (i.e. LH [31:16] OR UH [15:0]). For each of PCB[2:0], a logic ORing is performed of a subset of bits of OTP value [31:0], in which for the generation of each bit of PCB[2:0], only one of the pair of the bit value and its redundant bit value is used. (In FIG. 2, the value of "b" before the numerical value refers to the bit location of the OTP value. For example, b2 refers to OTP value [2].) The PCB values are generated as follows:

PCB[0]=b29 OR b27 OR b22 OR b20 OR b15 OR b12 OR b7 OR b5 OR b3 OR b0

PCB[1]=b30 OR b25 OR b23 OR b18 OR b16 OR b13 OR b10 OR b8 OR b6 OR b1

PCB[2]=b28 OR b26 OR b24 OR b21 OR b19 OR b17 OR b11 OR b9 OR b4 OR b2

PCB[3]=b14

PCB[4]=b31

As illustrated in FIG. 2, the bit locations of OTP value [31:0] in squares are used to generate PCB[0], the bit locations in circles are used to generate PCB[1], and the bit locations in triangles are used to generate PCB[2]. In this manner, note that for each pair of redundant bits programmed together, including the programmed bit indicated by a write request and its corresponding redundant bit (e.g. the pair of b0 and b16, the pair of b1 and b17, the pair of b8 and b24, etc.), only one of the pair of redundant bits is used in generating any of the PCBs. Of b0 and b16, b0 is used to generate PCB[0] and not used for PCB[1] nor PCB[2], while b16 is used to generate PCB[1] and not used for PCB[0] nor PCB[2]. In this manner, each time a bit in OTP value [31:0] is programmed, an additional bit value of one is ORed to generate any of PCB[2:0].

For example, if b0 is being programmed with a write access request, a value of 0x00010001 (for OTP value [31:0]) is written as WDATA_OTP into OTP 104 (in which a "0x" preceding a value indicates a hexadecimal value). In doing so, only b0 and b16 are being programmed to one (or, if already a one, is maintained as a one), leaving the remaining bit values unaffected. For the corresponding set of PCBs, this results in each of PCB[0] and PCB[1] being programmed to one, while PCB[2] remains a zero (assuming that the 32-bit OTP value started as completely unprogrammed). Therefore, note that each time one bit is programmed, two bits (the one bit and its redundant bit) are actually programmed in OTP 104. This should result in two bits of PCB[2:0] being programmed (since the one bit and its redundant bit affect two different PCBs). If additional bits of the 32-bit OTP value are subsequently programmed (e.g. b2 and b18), then PCB[2] and PCB[1] are programmed (yet, since PCB[1] was already programmed, it remains unchanged, e.g., programmed). However, since subsequent bits only result in ORing of additional ones, there is never a need to "unprogram" any of the PCBs. Also, with PCB [2:0] generated in this way (to ensure that if a single bit is written to a redundant word, then two PCBs will be set), an all 0-attack (in which the read value from OTP 104 will be forced to all 0s) will always be detected as a multiple bit failure using the redundant bit protection scheme if one or more bits have been programmed.

PCB[4:3] are constructed using the underlined bit locations of FIG. 2 to detect an all 1-attack (in which the read value from OTP 104 is forced to all 1s). The all 1-attack is less likely than an all 0-attack in the case of fuse box technologies. PCB[3] is the value of b14 and PCB[4] is the value of b31. Note that both of these bits correspond to the top two MSBs of the word (e.g. LH) or redundant word (e.g. UH) because these are less likely to be legitimately programmed to one.

Redundant circuitry 108, in response to a read request, receives RDATA_OTP and RERROR_BITS from the OTP array of OTP 104 as RDATA and RPCB, and uses these values to determine whether an error has occurred, and can provide information as to whether the error is a single bit failure (reliability failure) or due to an attack. Referring back to FIG. 1, in response to a read access request, RDATA_OTP is provided as RDATA to redundant circuitry 108, which provides RDATA as DATA to PCB generator 110. PCB generator 110 then generates PCB[4:0], as was described above. This is compared, by comparator 112, to the expected PCB values for RDATA received from OTP 104 as RPCB. If they match, comparator 112 provides the match indicator as indicating a match, and thus no error. However, if they do not match, the match indicator indicates no match and thus an error, resulting in assertion of ERROR INDICATOR to indicate the occurrence of the error.

In the case that an error is indicated, the values of the PCBs can be used to provide information as to the type of error. For example, referring back to the example in which 0x00010001 was programmed as the OTP value, the corresponding PCB[2:0] was programmed to 0b011 (in which the "0b" indicates a binary value). If, upon a read access request, 0b011 is returned as RPCB but the OTP value (RDATA) is instead read back as 0x00000001, PCB generator 110 generates PCB as 0b001, in which comparator 112 would detect that there is a single bit mismatch between the generated PCB and the expected PCB (RPCB). This indicates that likely a single bit failed in RDATA. However, in the case of an all 0-attack, the OTP value (RDATA) is forced to all 0's, in which PCB generator 110 would generate PCB as 0b000, resulting in a multiple bit (multi-bit) mismatch between the generated PCB and the RPCB. This instead indicates that it is likely an all 0's attack of RDATA rather than a single bit error in RDATA. Although, in either case, the read data cannot be corrected using the PCBs (since it is unknown which bit or bits failed), redundant circuitry 108 can still differentiate between a one-bit or multi-bit error (each resulting in assertion of ERROR INDICATOR).

While an all-0 attack may be more likely than an all-one attack, in the above example, if RDATA were instead forced to all ones, PCB[4:0] would be generated by PCB generator 110 as 0b11111, yet RPCB is returned as 0b00011. In this case, since b31 (for PCB[4]) and b14 (for PCB[3]) are the higher order bits of the OTP value, it is likely that all of the lower PCBs (PCB[2:0]) are already programmed because they result from ORing multiple data bits together, as was described above. In the case of an all 1-attack, RDATA is forced to 0x11111111, which will result in generating PCB [4:3] as 0b11. However, if any of RPCB is still unprogrammed, an error will be indicated, resulting in assertion of ERROR INDICATOR.

In one embodiment, each OTP value in OTP 104 has a corresponding set of bits for storing the error bits. For example, for a 32-bit OTP value, 8-bits may be reserved for each 32-bit value stored in OTP 104. In this example, for ECC, 7 of the 8 bits can be used to store the ECC check bits. In the case of the set of PCBs, the 8 bits can be used to store PCB[4:0], and the remaining 3 bits (PCB[7:5]) can be used store additional information for each OTP value. In one embodiment, PCB[6:5] can be used to redundantly store a bit that indicates whether or not the corresponding OTP value in OTP 104 has been "zeroized," in which "zeroized" refers to destroying the data in the corresponding OTP value. In the case of fuses, "zeroizing" can mean that all bits were programmed to one or written to a state which destroys the data. In one embodiment, PCB[7] can be a bit which indicates if the word uses an error protection scheme or not. That is, in this embodiment, if PCB[7] is programmed to one, the corresponding OTP value has been programmed with something. (Note that the set of bits for storing the error bits can be stored in OTP 104 adjacent the corresponding OTP value which it protects, or can be stored elsewhere within OTP 104.)

Referring back to FIG. 1, ECC circuitry 114 operates as known in the art, in which, for each write access request, ECC generator 116 receives WRITE_DATA and, if ECC bits are provided with the WRITE_DATA, applies ECC to determine if there are errors, correcting them if possible, and provides the corrected WRITE_DATA to be written into OTP 104 as WDATA_OTP. ECC circuitry 114 also provides the corrected WRITE_DATA as DATA to ECC generator 116 which generates the corresponding ECC check bits as ECCbits [6:0] (assuming the OTP values, and thus WRITE_DATA, are 32-bit values). The generated ECCbits are provided as WECCbits which are written into OTP 104 as WERROR_BITS, corresponding to WDATA_OTP. Note that in this case, any write to OTP 104 using the ECC protection scheme, has to be a full write in which the ECC check bits are generated based on all 32 bits of the write value. For each read access request, ECC generator 116 receives RDATA from OTP 104 and generates ECCbits [6:0], and comparator 118 compares these generated ECCbits with the expected ECCbits read from OTP 104 (received as RECCbits). A mismatch indicates an error. If possible (such as in the case of a single bit error), ECC circuitry 114 corrects RDATA and provides the corrected RDATA as READ_DATA back to the requestor (without asserting the ERROR INDICATOR). If the error cannot be corrected (such as in the case of a multi-bit error), ECC circuitry 114 asserts the ERROR INDICATOR. While the ECC protection scheme may provide a more robust error detection and correction scheme as compared to the redundant protection scheme, it typically requires more time and power to implement, and possibly more storage space as well.

As described above, the generation of PCBs can be used for an OTP value which is protected by a redundant bit protection scheme. However, in alternate embodiments, an OTP value, which can be incrementally written over time, may not be protected by an ECC protection scheme nor by a redundant bit protection scheme. For example, all or a portion of OTP 104 may store OTP values which are protected only the corresponding sets of PCBs as error bits (without using redundant bits). In this case, though, PCBs can still be used to provide protection to the OTP value. For example, error circuitry 106 can be configured to, in response to a write request to program one or more bits (e.g. such as a single bit) of an OTP value in the OTP memory, program one or more bits of the OTP value in the OTP memory, generate a set of PCBs corresponding to the OTP value in which each PCB is generated as a logic function of a different subset of bits of the OTP value, and program the set of PCBs into the OTP memory. In this embodiment, PCB generator 110 could be used to generate PCBs for any OTP value, even if the OTP value does not include or use redundant bits. For example, the OTP value can simply be an N-bit value (such as a 32-bit value) in which the upper and lower halves are not redundant to each other. Circuitry similar to redundant circuitry 108 could be used in error circuitry 106, which includes circuitry like PCB generator 110 and comparator 112, but may not include circuit 122. In one embodiment, for a 32-bit OTP value, the same logic functions as illustrated in FIG. 2 could be used to generate each of PCB[4:0]. That is, a set of PCBs (e.g. PCB[2:0]) can be generated using a same logic function (e.g. a logical ORing) on different subsets of bits of the OTP value, in which, for example, for the programming of the PCBs, the logic function only results in each PCB being programmed or remaining programmed in the OTP memory but not cleared.

Different types of OTPs can be used to implement OTP 104. For example, different types of fuses can be used, or other types of memories, such as OTP magneto-resistive random access memory (MRAM) OTP. In some of these cases, an unprogrammed bit may instead correspond to a logic level one, and the programmed bit to a logic level zero. In this case, rather than generating each of PCB[2:0] by ORing the subset of bits, they can instead be generated by ANDing the subset of bits. Therefore, in the example of FIG. 2, the ORs can simply be replaced with ANDs. This still allows the PCBs to be incrementally programmed as OTP bits are programmed at different times, as described above in the example of FIG. 2.

Therefore, in either case of the unprogrammed bit corresponding to a logic level zero or corresponding to a logic level one, a set of PCBs can be generated in which each PCB is generated as a logic function which results in the PCB being programmed only and not "unprogrammed" with each subsequent write to the corresponding OTP value. In this manner, the PCBs can be incrementally written, as opposed to ECC check bits. Note also that the error bits (either ECC check bits or PCBs) can be generated by hardware, as illustrated in FIG. 1, or can be generated by software executing on the SoC.

Also, the example subset of bits of the OTP value used for generating each of the PCBs are merely example combinations. Alternate embodiments may OR a different subset of bits of the OTP value (or may perform other logic functions or logical combinations, such as ANDing, of different subsets of bits). In the case of a redundant bit protection scheme, these alternate embodiments may also result in PCBs in which more than one PCB is programmed when a bit and its redundant bit are programmed. Also, while the illustrated embodiment illustrates the use of 3 PCBs to primarily detect an all 0-attack, alternate embodiments may use more bits, as needed. Similarly, different bits or combination of bits of the OTP value can be used to generate bits to primarily detect an all 1-attack (e.g. such as PCB[4:3] in the above examples). These bits to primarily detect an all 1-attack may be those bits which are least likely to be set (or least likely to be set before all or most of the other bits of the OTP value are set). Therefore, the number of PCBs and the number of bits of the OTP value used to generate each PCB is dependent upon the particular application, and may depend on such factors as how many bits are in each OTP value (e.g. 16 bits, 32 bits, 64 bits, etc.), the character of how the individual bits are programmed (e.g. such as when the MSBs are generally programmed later in time after the LSBs), etc.

Also, in alternate embodiments, the redundant bit protection scheme may store a bit more times than just twice. In this embodiment, when a particular OTP bit is programmed, two (or more) other redundant bits may be programmed as well. In this case, more PCBs may be used, as needed, to provide the appropriate indication of error (and the possible differentiation between bit failures and attacks). Each PCB would again be selected as logical combinations of subsets of bits of the OTP value in which the bit and any of its redundant values are used to generate different PCBs, and the logical combination configured so as to ensure that the PCBs can be sequentially programmed (set), but not unprogrammed (cleared), as bits of the OTP value are programmed. Also, while in the illustrated embodiment, the pair of bit and redundant bit are located within separate words of an OTP value (in LH and UH, respectively), in alternate embodiments, the redundant bit or bits may be stored in separate locations in the OTP memory, outside the OTP value itself. For example, each of the LH and the redundant UH values (and another other redundant values) can be stored at separate memory locations of the OTP memory.

The OTP values whose bits are programmed at different times can be any type of OTP values which store different types of information. For example, in one use case, the OTP values can be used as lock bit fuses. These are sets of 3-bits set for Read, Overwrite, and Read protect which can be protected using redundant bits. In this use case, the read protect bits are the least likely protect bits to be set, in which the PCBs can be generated accordingly. In another use case, the OTP values can be used for logging counters which set a bit on each occurrence to log a particular event. These bits are normally assigned from the LSB and the counter files towards the MSB. In yet another use case, the OTP values can be used as anti-replay counters in which these counters operate similar to logging counters or they can be used to store actual version numbers (in a bit expanded form (e.g. version 0=0x0000, version 1=0x00001, version 2=0x0003, etc.). These can be stored as redundant values, as described in the examples above. These use cases are only a few examples, and there can be other use cases, and the generation of the PCBs can be designed differently, as needed, to handle the different use cases.

Therefore, by now it should be appreciated that there has been provided an improved protection scheme for OTP bits through the use of PCBs which can be sequentially generated in time as the OTP bits are programmed over time. The OTP bits can be additionally protected with a redundant bit protection scheme in combination with PCBs. Further, the PCBs can be used to provide information as to whether an error is likely due simply to a bit failure (indicating a reliability issue) or due to an attack (e.g. an all 0-attach or an all 1-attack). In one embodiment, a set of PCBs is generated and stored with each addressable OTP value, in which a corresponding upper half of each OTP value corresponds to redundant bits for a corresponding lower half of the OTP value. In one embodiment, the set of PCBs for an OTP value includes multiple PCBs and is generated such that a bit and a redundant bit of the OTP value are not used to generate the same PCB of the set of PCBs.

The term "set" and "program" are used with respect to OTP bits herein when referring to placing an OTP bit in (or writing an OTP bit to) its programmed state (in which, depending on the implementation of the OTP memory, the programmed state may correspond to a logic level one or logic level zero, and the unprogrammed state may correspond to the virgin state of the OTP bit, corresponding to a logic level zero or one, respectively). The terms "assert" and "negate" (or "deassert") are used herein when referring to the rendering of a signal into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The combination "0x" preceding a number indicates that the number is represented in its hexadecimal or base sixteen form. The combination "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary memory system within an information processing architecture (e.g. SoC), these exemplary architectures are presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of memory system 100, as well as the data processing system or SoC in which it resides, are circuitry located on a single integrated circuit or within a same device. Alternatively, memory system 100 may be located on one of any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of system 100, for example, from computer readable media stored within storage circuitry of memory system 100 or external to memory system 100. Such computer readable media may be permanently, removably or remotely coupled to memory system 100, and may be executed by any processing circuitry (e.g. cores or central processing units (CPUs) coupled to memory system 100. The computer readable media may include, for example and without limitation, any number of the following: nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc..

Although the invention is described herein with reference to specific embodiments, various modifications and changes can be made without departing from the scope of the present invention as set forth in the claims below. For example, the redundant bits for each programmed bit in the redundant protection scheme may be located elsewhere within the OTP memory and not necessarily in the redundant upper (or lower) word of the OTP value. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a memory system includes a one-time-programmable (OTP) memory; and an OTP controller coupled to the OTP memory. The OTP memory includes redundant circuitry configured to, in response to a write request to program a single bit of an OTP value to the OTP memory: program both a bit of the OTP value in the OTP memory and a redundant bit in the OTP memory, generate a set of programming check bits (PCBs), as error bits, corresponding to the OTP value including a first PCB based on the bit and a second PCB, different from the first PCB, based on the redundant bit, and program the set of PCBs into the OTP memory. In one aspect of the embodiment, each of the bit and the redundant bit are bits of the OTP value. In a further aspect, the bit is in a first portion of the OTP value and the redundant bit is in a second portion of the OTP value, wherein the OTP value has a total number of bits equal to an addressable data size of the OTP memory. In another aspect of the embodiment, the redundant circuitry is configured to, for each PCB in the set of PCBs corresponding to the OTP value, perform a logical ORing of a subset of bits of the OTP value to obtain the PCB. In a further aspect, the subset of bits used for generating each PCB in the set of PCBs corresponding to the OTP value are different from each other and do not include any pairs of redundant bits. In another further aspect, the first PCB is generated by performing a logical OR on a first subset of bits of the OTP value, including the bit, and the second PCB is generated by performing a logic OR on a second subset of bits of the OTP value, including the redundant bit. In another aspect of the embodiment, the redundant circuitry is configured to, for each PCB in the set of PCBs corresponding to the OTP value, perform a logical combination of a subset of bits of the OTP value to obtain the PCB wherein, upon programming the set of PCBs into the OTP memory, the logical combination only results in the PCB being programmed or remaining programmed but not cleared. In a further aspect, the redundant circuitry is further configured to, in response to a write request to subsequently program a next single bit of the OTP memory, program both a next bit of the OTP value and a corresponding next redundant bit, generate a next value for the set of PCBs based on the bit, the next bit, the redundant bit, and the next redundant bit, and update the set of PCBs in the OTP memory by programming the next value of the set of PCBs into the OTP memory. In another aspect, the OTP memory is implemented as a fuse box, and each OTP value stored in the OTP memory is characterized as a fuse value. In yet another aspect, the OTP controller is configured to write each bit of the OTP value in the OTP memory sequentially in time and not all at once. In another aspect, the OTP controller further includes error correction and detection (ECC) circuitry configured to, in response to a write request to program a full OTP value to the OTP memory, programming the full OTP value to the OTP memory, generate a set of ECC check bits corresponding to the full OTP value, and program the set of ECC check bits into the OTP memory. In yet an other aspect, a first portion of the OTP memory includes OTP values stored in accordance with a redundant bit protection scheme, wherein the redundant circuitry is configured to process reads from and writes to the first portion of the OTP memory, and a second portion of the OTP memory includes OTP values stored in accordance with an ECC protection scheme, wherein the ECC circuitry is configured to process reads from and write to the second portion of the OTP memory. In a further aspect, each OTP value has a corresponding set of error bits stored in the OTP memory, wherein, in the first portion of the OTP memory, the sets of error bits stored for the OTP values includes corresponding PCBs generated by the redundant circuitry, and, in the second portion of the OTP memory, the sets of error bits stored for the OTP values includes corresponding ECC check bits generated by the ECC circuitry.

In another embodiment, a method in a memory system having a one-time-programmable (OTP) memory and an OTP controller coupled to the OTP memory includes, in response to a write request to program a single bit in the OTP memory, programming both a bit of an OTP value in the OTP memory and a redundant bit of the bit in the OTP memory; generating a set of programming check bits (PCBs) corresponding to the OTP value, wherein each PCB in the set of PCBs is generated by performing a logical combination of a different subset of bits of the OTP value, wherein any subset of bits of the OTP value used to generate a PCB of the set of PCBs does not include any bits together with their redundant bits; and programming the set of PCBs corresponding to the OTP value to the OTP memory. In one aspect of the another embodiment, the generating the set of PCBs corresponding to the OTP value is performed such that the logical combination performed for each PCB in the set of PCBs only results in any PCB of the set of PCBs being programmed or remaining programmed but not cleared. In another aspect, the method further includes, in response to a read request from the OTP memory, receiving read data and corresponding error bits from the OTP memory; when the read request is from a first portion of the OTP memory, generating a set of PCBs corresponding to the read data and using the generated set of PCBs corresponding to the received read value and the received corresponding error bits to determine occurrence of an error in accordance with a redundant bit protection scheme; and, when the read request is from a second portion of the OTP memory, generating ECC check bits corresponding to the read data and using the generated ECC check bits corresponding to the received read data and the received corresponding error bits to determine occurrence of an error in accordance with an ECC protection scheme. In yet another aspect, the logical combination of different subsets of bits of the OTP value includes a logical ORing or a logic ANDing, based on a virgin state of OTP memory bits.

In yet another embodiment, a memory system includes a one-time-programmable (OTP) memory configured to store OTP values and corresponding programming check bits (PCBs); and an OTP controller coupled to the OTP memory. The OTP controller is configured to, in response to a write request to program a single bit of an OTP value to the OTP memory, program a bit of the OTP value in the OTP memory, generate a set of PCBs corresponding to the OTP value in which each PCB of the set of PCBs is generated as a logic function of a different subset of bits of the OTP value, and program the set of PCBs into the OTP memory, wherein, for programming the set of PCBs, the logic function only results in each PCB being programmed or remaining programmed in the OTP memory but not cleared. In one aspect of the yet another embodiment, the OTP controller is configured to, in response to a read request from the OTP memory, receive read data and corresponding error bits from the OTP memory, generate a set of PCBs corresponding to the read data, wherein each PCB of the set of PCBs corresponding to the read data is generated as the logic function of a different subset of bits of the read data, and determine occurrence of an error using the generated set of PCBs corresponding to the read data and the received error bits. In a further aspect, for each PCB, the logic function is one of a logical ORing or a logical ANDing of the different subset of bits.

What is claimed is:

1. A memory system comprising:
a one-time-programmable (OTP) memory; and
an OTP controller coupled to the OTP memory, comprising:
redundant circuitry configured to, in response to a write request to program a single bit of an OTP value to the OTP memory:
program both a bit of the OTP value in the OTP memory and a redundant bit in the OTP memory,
generate a set of programming check bits (PCBs), as error bits, corresponding to the OTP value including a first PCB based on the bit and a second PCB, different from the first PCB, based on the redundant bit, and
program the set of PCBs into the OTP memory.

2. The memory system of claim 1, wherein each of the bit and the redundant bit are bits of the OTP value.

3. The memory system of claim 2, wherein the bit is in a first portion of the OTP value and the redundant bit is in a second portion of the OTP value, wherein the OTP value has a total number of bits equal to an addressable data size of the OTP memory.

4. The memory system of claim 1, wherein the redundant circuitry is configured to, for each PCB in the set of PCBs corresponding to the OTP value, perform a logical ORing of a subset of bits of the OTP value to obtain the PCB.

5. The memory system of claim 4, wherein the subset of bits used for generating each PCB in the set of PCBs corresponding to the OTP value are different from each other and do not include any pairs of redundant bits.

6. The memory system of claim 4, wherein the first PCB is generated by performing a logical OR on a first subset of bits of the OTP value, including the bit, and the second PCB is generated by performing a logic OR on a second subset of bits of the OTP value, including the redundant bit.

7. The memory system of claim 1, wherein the redundant circuitry is configured to, for each PCB in the set of PCBs corresponding to the OTP value, perform a logical combination of a subset of bits of the OTP value to obtain the PCB wherein, upon programming the set of PCBs into the OTP memory, the logical combination only results in the PCB being programmed or remaining programmed but not cleared.

8. The memory system of claim 7, wherein the redundant circuitry is further configured to, in response to a write request to subsequently program a next single bit of the OTP memory, program both a next bit of the OTP value and a corresponding next redundant bit, generate a next value for the set of PCBs based on the bit, the next bit, the redundant bit, and the next redundant bit, and update the set of PCBs in the OTP memory by programming the next value of the set of PCBs into the OTP memory.

9. The memory system of claim 1, wherein the OTP memory is implemented as a fuse box, and each OTP value stored in the OTP memory is characterized as a fuse value.

10. The memory system of claim 1, wherein the OTP controller is configured to write each bit of the OTP value in the OTP memory sequentially in time and not all at once.

11. The memory system of claim 1, wherein the OTP controller further includes:
error correction and detection (ECC) circuitry configured to, in response to a write request to program a full OTP value to the OTP memory, programming the full OTP value to the OTP memory, generate a set of ECC check bits corresponding to the full OTP value, and program the set of ECC check bits into the OTP memory.

12. The memory system of claim 1, wherein:
a first portion of the OTP memory includes OTP values stored in accordance with a redundant bit protection scheme, wherein the redundant circuitry is configured to process reads from and writes to the first portion of the OTP memory, and
a second portion of the OTP memory includes OTP values stored in accordance with an ECC protection scheme, wherein the ECC circuitry is configured to process reads from and write to the second portion of the OTP memory.

13. The memory system of claim 12, wherein each OTP value has a corresponding set of error bits stored in the OTP memory, wherein, in the first portion of the OTP memory, the sets of error bits stored for the OTP values includes corresponding PCBs generated by the redundant circuitry, and, in the second portion of the OTP memory, the sets of error bits stored for the OTP values includes corresponding ECC check bits generated by the ECC circuitry.

14. In a memory system having a one-time-programmable (OTP) memory and an OTP controller coupled to the OTP memory, a method includes:
in response to a write request to program a single bit in the OTP memory, programming both a bit of an OTP value in the OTP memory and a redundant bit of the bit in the OTP memory;
generating a set of programming check bits (PCBs) corresponding to the OTP value, wherein each PCB in the set of PCBs is generated by performing a logical combination of a different subset of bits of the OTP value, wherein any subset of bits of the OTP value used to generate a PCB of the set of PCBs does not include any bits together with their redundant bits; and
programming the set of PCBs corresponding to the OTP value to the OTP memory.

15. The method of claim 14, wherein the generating the set of PCBs corresponding to the OTP value is performed such that the logical combination performed for each PCB in the set of PCBs only results in any PCB of the set of PCBs being programmed or remaining programmed but not cleared.

16. The method of claim 14, further comprising:
in response to a read request from the OTP memory, receiving read data and corresponding error bits from the OTP memory;
when the read request is from a first portion of the OTP memory, generating a set of PCBs corresponding to the read data and using the generated set of PCBs corresponding to the received read value and the received corresponding error bits to determine occurrence of an error in accordance with a redundant bit protection scheme; and
when the read request is from a second portion of the OTP memory, generating ECC check bits corresponding to the read data and using the generated ECC check bits corresponding to the received read data and the received corresponding error bits to determine occurrence of an error in accordance with an ECC protection scheme.

17. The method of claim 14, wherein:
the logical combination of different subsets of bits of the OTP value comprises a logical ORing or a logic ANDing, based on a virgin state of OTP memory bits.

18. A memory system comprising:
a one-time-programmable (OTP) memory configured to store OTP values and corresponding programming check bits (PCBs); and an OTP controller coupled to the OTP memory, configured to:
  in response to a write request to program a single bit of an OTP value to the OTP memory:
    program a bit of the OTP value in the OTP memory,
    generate a set of PCBs corresponding to the OTP value in which each PCB of the set of PCBs is generated as a logic function of a different subset of bits of the OTP value, and
    program the set of PCBs into the OTP memory, wherein, for programming the set of PCBs, the logic function only results in each PCB being programmed or remaining programmed in the OTP memory but not cleared.

19. The memory system of claim 18, wherein the OTP controller is configured to, in response to a read request from the OTP memory:
  receive read data and corresponding error bits from the OTP memory,
  generate a set of PCBs corresponding to the read data, wherein each PCB of the set of PCBs corresponding to the read data is generated as the logic function of a different subset of bits of the read data, and
  determine occurrence of an error using the generated set of PCBs corresponding to the read data and the received error bits.

20. The memory system of claim 19, wherein, for each PCB, the logic function is one of a logical ORing or a logical ANDing of the different subset of bits.

* * * * *